US012610780B2

(12) United States Patent
Tarabulski

(10) Patent No.: US 12,610,780 B2
(45) Date of Patent: Apr. 21, 2026

(54) BONDING SYSTEMS USING A PREDETERMINED TILT PROFILE

(71) Applicant: Kulicke and Soffa Industries, Inc., Fort Washington, PA (US)

(72) Inventor: Matthew Tarabulski, Ambler, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 19/078,696

(22) Filed: Mar. 13, 2025

(65) Prior Publication Data

US 2025/0218841 A1 Jul. 3, 2025

Related U.S. Application Data

(63) Continuation of application No. 18/131,431, filed on Apr. 6, 2023, now Pat. No. 12,266,556.

(60) Provisional application No. 63/330,170, filed on Apr. 12, 2022.

(51) Int. Cl.
  *H10P 72/50* (2026.01)
  *G05B 19/402* (2006.01)
  *H10P 72/00* (2026.01)
  *H10P 72/78* (2026.01)

(52) U.S. Cl.
  CPC ............ *H10P 72/50* (2026.01); *G05B 19/402* (2013.01); *H10P 72/0446* (2026.01); *H10P 72/78* (2026.01); *G05B 2219/49191* (2013.01)

(58) Field of Classification Search
  None
  See application file for complete search history.

(56) References Cited

U.S. PATENT DOCUMENTS

| 4,875,614 A | 10/1989 | Cipolla et al. |
| 4,899,921 A | 2/1990 | Bendat et al. |
| 5,029,383 A | 7/1991 | Snyder et al. |
| 5,190,205 A | 3/1993 | Ozawa et al. |
| 5,212,880 A | 5/1993 | Nishiguchi et al. |
| 5,384,000 A | 1/1995 | Nishiguchi |

(Continued)

FOREIGN PATENT DOCUMENTS

| JP | 2004221468 A | * | 8/2004 |
| JP | 2005209924 A | | 8/2005 |

(Continued)

OTHER PUBLICATIONS

International Search Report for PCT application No. PCT/US2023/017667 mailed Aug. 16, 2023.

*Primary Examiner* — Keith Walker
*Assistant Examiner* — Carlos J Gamino
(74) *Attorney, Agent, or Firm* — Christopher M. Spletzer, Sr.

(57) ABSTRACT

A bonding system for bonding a semiconductor element to a substrate is provided. The bonding system includes a bonding tool assembly for bonding a semiconductor element to a substrate. The bonding system also includes a support structure assembly for supporting the substrate. The bonding system further includes a vacuum sensor for sensing a vacuum leakage at an interface between the bonding tool assembly and the support structure assembly during contact therebetween. The vacuum sensor is also used in connection with a tilt adjustment between the bonding tool assembly and the support structure assembly.

12 Claims, 13 Drawing Sheets

(56)                References Cited

U.S. PATENT DOCUMENTS

| 5,422,554 | A | 6/1995 | Rohde |
| 5,683,026 | A | 11/1997 | Kawatani et al. |
| 5,745,986 | A | 5/1998 | Variot et al. |
| 6,041,996 | A | 3/2000 | Arikado |
| 6,179,938 | B1 | 1/2001 | Mannhart et al. |
| 6,244,493 | B1 | 6/2001 | Shimazaki et al. |
| 6,561,408 | B2 | 5/2003 | Hosotani et al. |
| 6,774,651 | B1 | 8/2004 | Hembree |
| 7,066,373 | B2 | 6/2006 | Behler |
| 7,219,419 | B2 | 5/2007 | Higashi et al. |
| 7,219,824 | B2 | 5/2007 | Tu et al. |
| 7,712,649 | B2 | 5/2010 | Kuramochi |
| 7,849,896 | B2 | 12/2010 | Choy et al. |
| 8,387,851 | B1 | 3/2013 | Yung et al. |
| 8,683,882 | B2 | 4/2014 | Jackson |
| 9,136,243 | B2 | 9/2015 | Schmidt-Lange et al. |
| 9,406,640 | B2 | 8/2016 | Seyama |
| 10,692,833 | B2 | 6/2020 | Kim et al. |
| 2005/0098610 | A1 | 5/2005 | Onobori et al. |
| 2011/0308738 | A1 | 12/2011 | Maki et al. |
| 2015/0083786 | A1* | 3/2015 | Okamoto ............... B23K 37/04 |
| | | | 228/9 |
| 2016/0005709 | A1 | 1/2016 | Wasserman et al. |
| 2016/0086830 | A1 | 3/2016 | Cheung et al. |
| 2019/0252349 | A1 | 8/2019 | Bajwa |
| 2020/0273759 | A1 | 8/2020 | Eder et al. |
| 2022/0130709 | A1* | 4/2022 | Jung ....................... H10P 72/78 |
| 2022/0384384 | A1 | 12/2022 | Wasserman et al. |
| 2023/0197670 | A1* | 6/2023 | Dzhangirov ...... H10W 72/0711 |
| | | | 228/101 |
| 2024/0186174 | A1 | 6/2024 | Moroishi et al. |

FOREIGN PATENT DOCUMENTS

| JP | 3891689 | | 3/2007 | |
| JP | 3891689 | B2 * | 3/2007 | ........ H10W 72/0711 |
| JP | 2013143388 | | 7/2013 | |
| JP | 2013143388 | A * | 7/2013 | ............ H01L 24/75 |
| KR | 10-2014-0139079 | A | 12/2014 | |
| KR | 10-2018-0040349 | A | 4/2018 | |
| KR | 10-2021-0009853 | A | 4/2021 | |
| KR | 102277210 | | 7/2021 | |

* cited by examiner

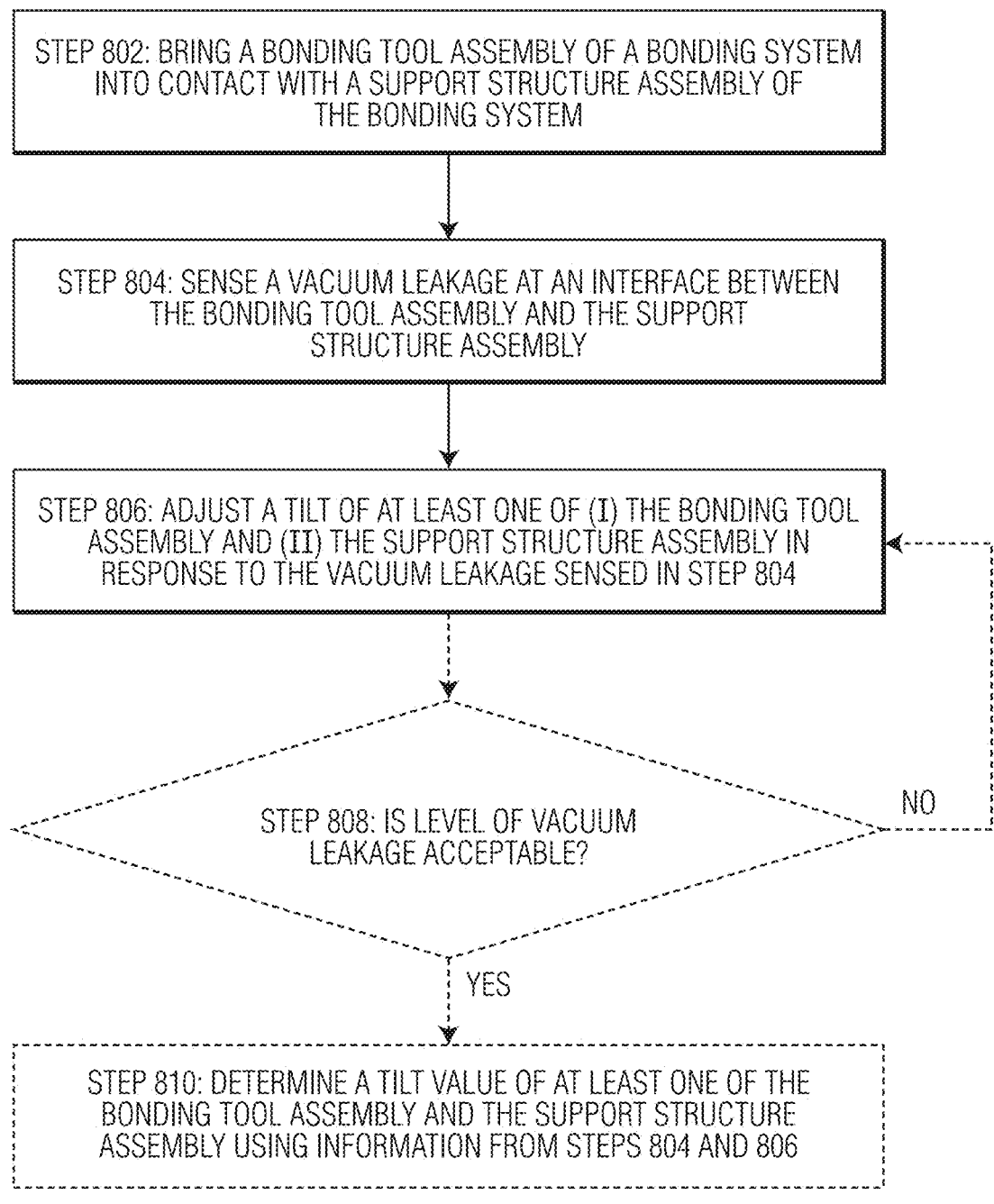

STEP 802: BRING A BONDING TOOL ASSEMBLY OF A BONDING SYSTEM INTO CONTACT WITH A SUPPORT STRUCTURE ASSEMBLY OF THE BONDING SYSTEM

STEP 804: SENSE A VACUUM LEAKAGE AT AN INTERFACE BETWEEN THE BONDING TOOL ASSEMBLY AND THE SUPPORT STRUCTURE ASSEMBLY

STEP 806: ADJUST A TILT OF AT LEAST ONE OF (I) THE BONDING TOOL ASSEMBLY AND (II) THE SUPPORT STRUCTURE ASSEMBLY IN RESPONSE TO THE VACUUM LEAKAGE SENSED IN STEP 804

STEP 808: IS LEVEL OF VACUUM LEAKAGE ACCEPTABLE?

NO

YES

STEP 810: DETERMINE A TILT VALUE OF AT LEAST ONE OF THE BONDING TOOL ASSEMBLY AND THE SUPPORT STRUCTURE ASSEMBLY USING INFORMATION FROM STEPS 804 AND 806

FIG. 8

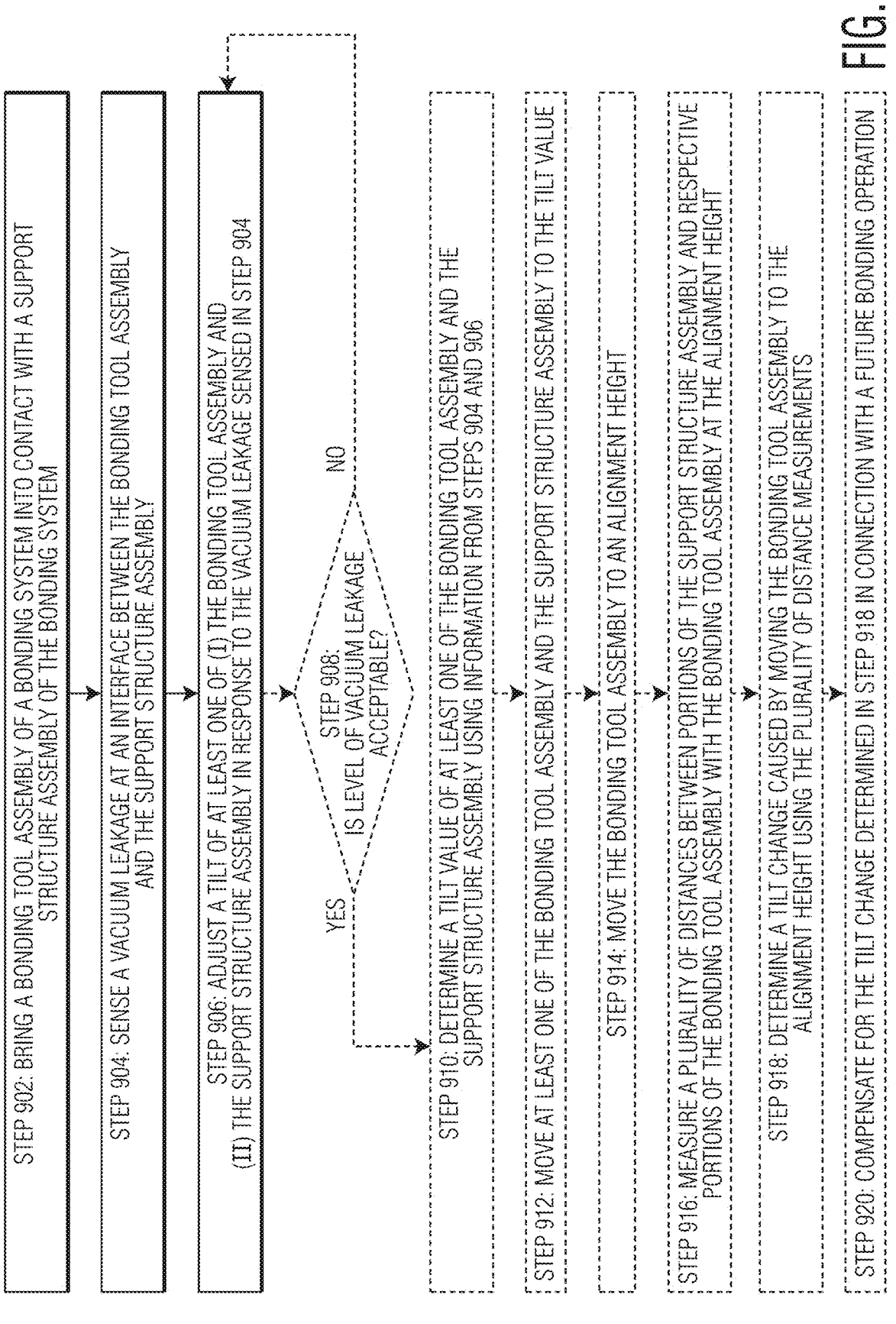

STEP 902: BRING A BONDING TOOL ASSEMBLY OF A BONDING SYSTEM INTO CONTACT WITH A SUPPORT STRUCTURE ASSEMBLY OF THE BONDING SYSTEM

STEP 904: SENSE A VACUUM LEAKAGE AT AN INTERFACE BETWEEN THE BONDING TOOL ASSEMBLY AND THE SUPPORT STRUCTURE ASSEMBLY

STEP 906: ADJUST A TILT OF AT LEAST ONE OF (I) THE BONDING TOOL ASSEMBLY AND (II) THE SUPPORT STRUCTURE ASSEMBLY IN RESPONSE TO THE VACUUM LEAKAGE SENSED IN STEP 904

STEP 908: IS LEVEL OF VACUUM LEAKAGE ACCEPTABLE?

YES

NO

STEP 910: DETERMINE A TILT VALUE OF AT LEAST ONE OF THE BONDING TOOL ASSEMBLY AND THE SUPPORT STRUCTURE ASSEMBLY USING INFORMATION FROM STEPS 904 AND 906

STEP 912: MOVE AT LEAST ONE OF THE BONDING TOOL ASSEMBLY AND THE SUPPORT STRUCTURE ASSEMBLY TO THE TILT VALUE

STEP 914: MOVE THE BONDING TOOL ASSEMBLY TO AN ALIGNMENT HEIGHT

STEP 916: MEASURE A PLURALITY OF DISTANCES BETWEEN PORTIONS OF THE SUPPORT STRUCTURE ASSEMBLY AND RESPECTIVE PORTIONS OF THE BONDING TOOL ASSEMBLY WITH THE BONDING TOOL ASSEMBLY AT THE ALIGNMENT HEIGHT

STEP 918: DETERMINE A TILT CHANGE CAUSED BY MOVING THE BONDING TOOL ASSEMBLY TO THE ALIGNMENT HEIGHT USING THE PLURALITY OF DISTANCE MEASUREMENTS

STEP 920: COMPENSATE FOR THE TILT CHANGE DETERMINED IN STEP 918 IN CONNECTION WITH A FUTURE BONDING OPERATION

FIG. 9

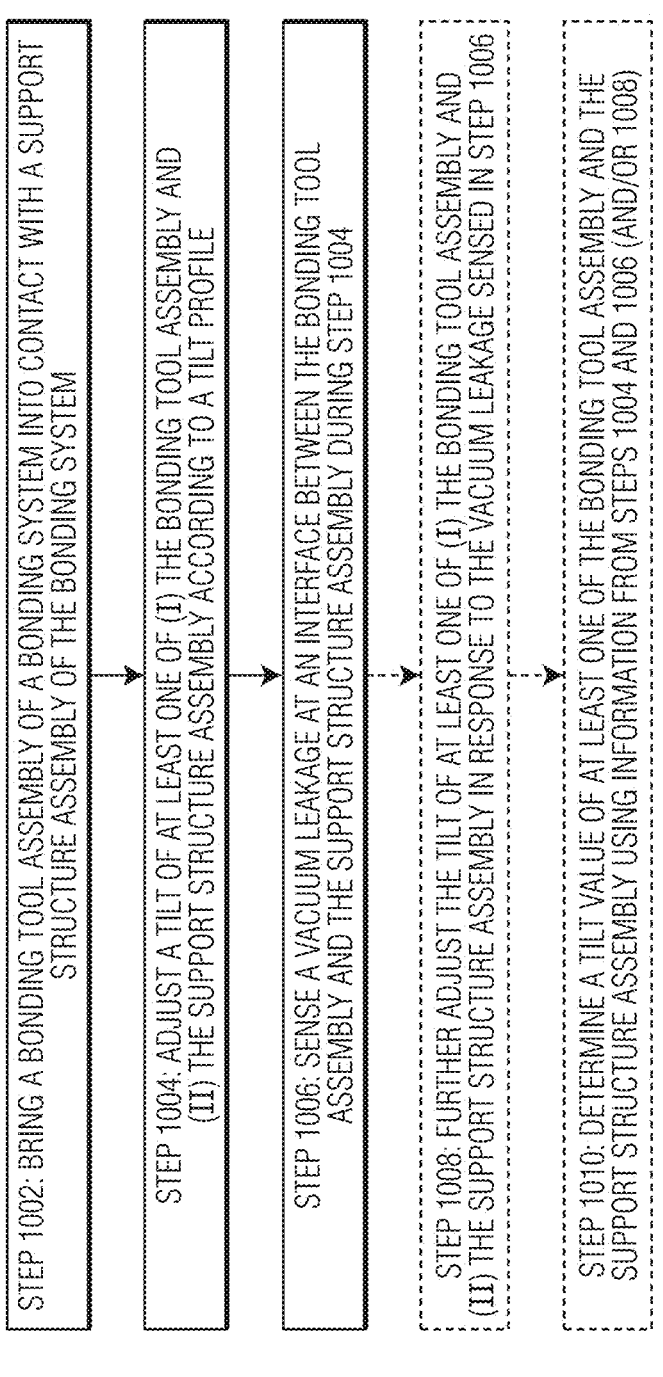

STEP 1002: BRING A BONDING TOOL ASSEMBLY OF A BONDING SYSTEM INTO CONTACT WITH A SUPPORT STRUCTURE ASSEMBLY OF THE BONDING SYSTEM

STEP 1004: ADJUST A TILT OF AT LEAST ONE OF (I) THE BONDING TOOL ASSEMBLY AND (II) THE SUPPORT STRUCTURE ASSEMBLY ACCORDING TO A TILT PROFILE

STEP 1006: SENSE A VACUUM LEAKAGE AT AN INTERFACE BETWEEN THE BONDING TOOL ASSEMBLY AND THE SUPPORT STRUCTURE ASSEMBLY DURING STEP 1004

STEP 1008: FURTHER ADJUST THE TILT OF AT LEAST ONE OF (I) THE BONDING TOOL ASSEMBLY AND (II) THE SUPPORT STRUCTURE ASSEMBLY IN RESPONSE TO THE VACUUM LEAKAGE SENSED IN STEP 1006

STEP 1010: DETERMINE A TILT VALUE OF AT LEAST ONE OF THE BONDING TOOL ASSEMBLY AND THE SUPPORT STRUCTURE ASSEMBLY USING INFORMATION FROM STEPS 1004 AND 1006 (AND/OR 1008)

FIG. 10

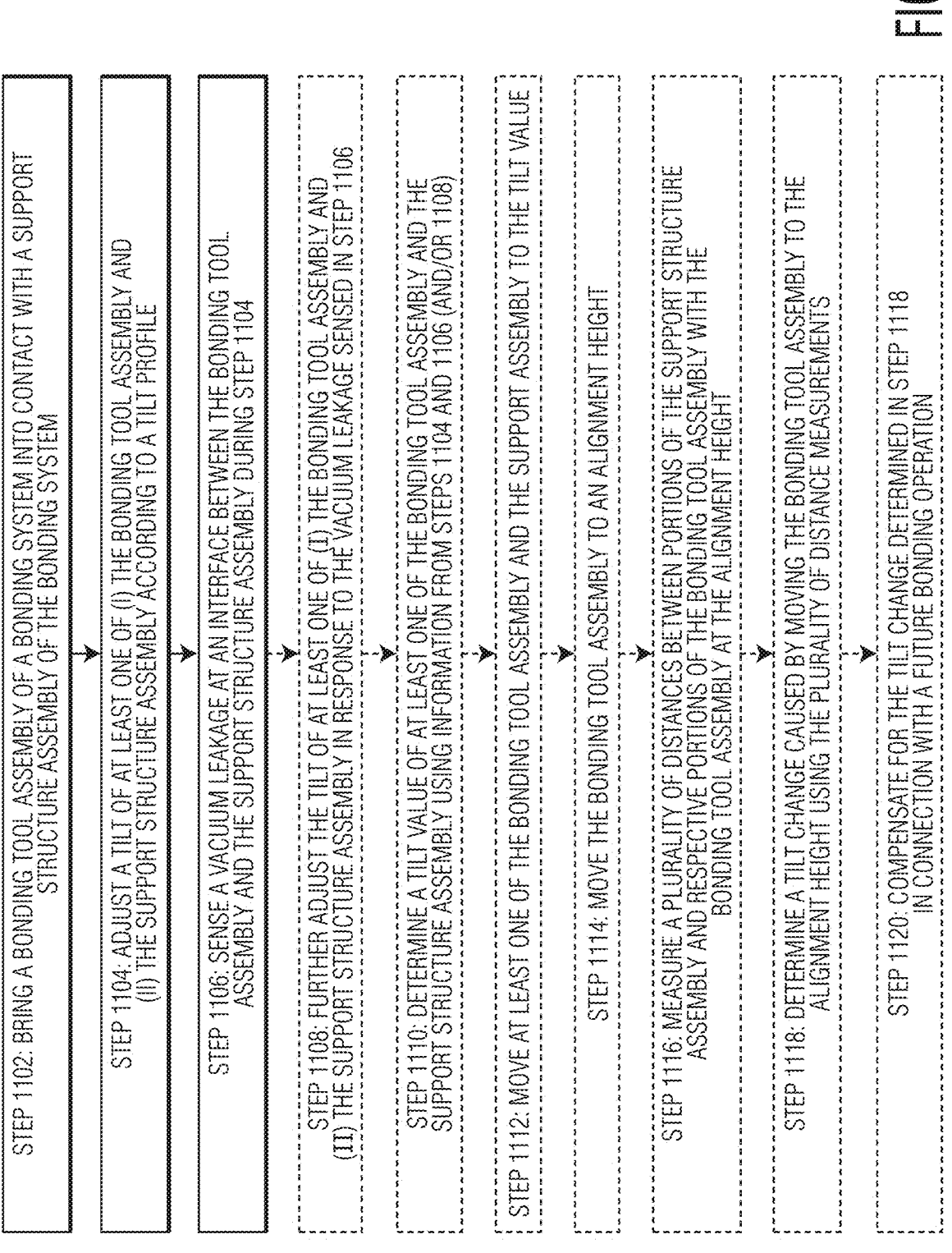

STEP 1102: BRING A BONDING TOOL ASSEMBLY OF A BONDING SYSTEM INTO CONTACT WITH A SUPPORT STRUCTURE ASSEMBLY OF THE BONDING SYSTEM

STEP 1104: ADJUST A TILT OF AT LEAST ONE OF (I) THE BONDING TOOL ASSEMBLY AND (II) THE SUPPORT STRUCTURE ASSEMBLY ACCORDING TO A TILT PROFILE

STEP 1106: SENSE A VACUUM LEAKAGE AT AN INTERFACE BETWEEN THE BONDING TOOL ASSEMBLY AND THE SUPPORT STRUCTURE ASSEMBLY DURING STEP 1104

STEP 1108: FURTHER ADJUST THE TILT OF AT LEAST ONE OF (I) THE BONDING TOOL ASSEMBLY AND (II) THE SUPPORT STRUCTURE ASSEMBLY IN RESPONSE TO THE VACUUM LEAKAGE SENSED IN STEP 1106

STEP 1110: DETERMINE A TILT VALUE OF AT LEAST ONE OF THE BONDING TOOL ASSEMBLY AND THE SUPPORT STRUCTURE ASSEMBLY USING INFORMATION FROM STEPS 1104 AND 1106 (AND/OR 1108)

STEP 1112: MOVE AT LEAST ONE OF THE BONDING TOOL ASSEMBLY AND THE SUPPORT ASSEMBLY TO THE TILT VALUE

STEP 1114: MOVE THE BONDING TOOL ASSEMBLY TO AN ALIGNMENT HEIGHT

STEP 1116: MEASURE A PLURALITY OF DISTANCES BETWEEN PORTIONS OF THE SUPPORT STRUCTURE ASSEMBLY AND RESPECTIVE PORTIONS OF THE BONDING TOOL ASSEMBLY WITH THE BONDING TOOL ASSEMBLY AT THE ALIGNMENT HEIGHT

STEP 1118: DETERMINE A TILT CHANGE CAUSED BY MOVING THE BONDING TOOL ASSEMBLY TO THE ALIGNMENT HEIGHT USING THE PLURALITY OF DISTANCE MEASUREMENTS

STEP 1120: COMPENSATE FOR THE TILT CHANGE DETERMINED IN STEP 1118 IN CONNECTION WITH A FUTURE BONDING OPERATION

FIG. 11

BONDING SYSTEMS USING A PREDETERMINED TILT PROFILE

CROSS REFERENCE TO RELATED APPLICATIONS

This application is a continuation application of U.S. patent application Ser. No. 18/131,431, filed on Apr. 6, 2023, which claims the benefit of U.S. Provisional Application No. 63/330,170, filed on Apr. 12, 2022, the contents of both of which are herein incorporated by reference.

FIELD

The invention relates to methods of adjusting a tilt between a bonding tool assembly and a support structure assembly of an electronic component bonding system, and related bonding systems.

BACKGROUND

In certain aspects of the semiconductor packaging industry, semiconductor elements are bonded to bonding locations. For example, in conventional die attach (also known as die bonding) applications, a semiconductor die is bonded to a bonding location (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.), with conductive structures (e.g., conductive bumps, contact pads, solder bumps, conductive pillars, copper pillars, etc.) providing electrical interconnection between the semiconductor element and the bonding location.

In many applications (e.g., thermocompression bonding of semiconductor elements including solder bumps, etc.) it is particularly desirable to have a significant level of parallelism between the bonding tool and respective portions of a support structure of the bonding machine. U.S. Pat. No. 9,136,243 ("SYSTEMS AND METHODS FOR DETERMINING AND ADJUSTING A LEVEL OF PARALLELISM RELATED TO BONDING OF SEMICONDUCTOR ELEMENTS") is an example of a conventional approach to determining and adjusting such parallelism.

It would be desirable to provide improved systems for, and methods of, determining and adjusting the parallelism between elements of bonding system, including as related to adjusting the tilt of the elements.

SUMMARY

According to an exemplary embodiment of the invention, a method of adjusting a tilt between a bonding tool assembly and a support structure assembly of a bonding system is provided. The method includes the steps of: (a) bringing a bonding tool assembly of a bonding system into contact with a support structure assembly of the bonding system; (b) sensing a vacuum leakage at an interface between the bonding tool assembly and the support structure assembly; and (c) adjusting a tilt of at least one of (i) the bonding tool assembly and (ii) the support structure assembly in response to the vacuum leakage sensed in step (b).

According to another exemplary embodiment of the invention, another method of adjusting a tilt between a bonding tool assembly and a support structure assembly of a bonding system is provided. The method includes the steps of: (a) bringing a bonding tool assembly of a bonding system into contact with a support structure assembly of the bonding system; (b) adjusting a tilt of at least one of (i) the bonding tool assembly and (ii) the support structure assembly according to a tilt profile; and (c) sensing a vacuum leakage at an interface between the bonding tool assembly and the support structure assembly during step (b).

According to yet another exemplary embodiment of the invention, a bonding system for bonding a semiconductor element to a substrate is provided. The bonding system includes a bonding tool assembly for bonding a semiconductor element to a substrate. The bonding system also includes a support structure assembly for supporting the substrate. The bonding system further includes a vacuum sensor for sensing a vacuum leakage at an interface between the bonding tool assembly and the support structure assembly during contact therebetween. The vacuum sensor is also used in connection with a tilt adjustment between the bonding tool assembly and the support structure assembly.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 8-11 are flow diagrams illustrating various methods of adjusting a tilt between a bonding tool assembly and a support structure assembly of a bonding system in accordance with various exemplary embodiments of the invention.

DETAILED DESCRIPTION

Figures 1A, 1B:
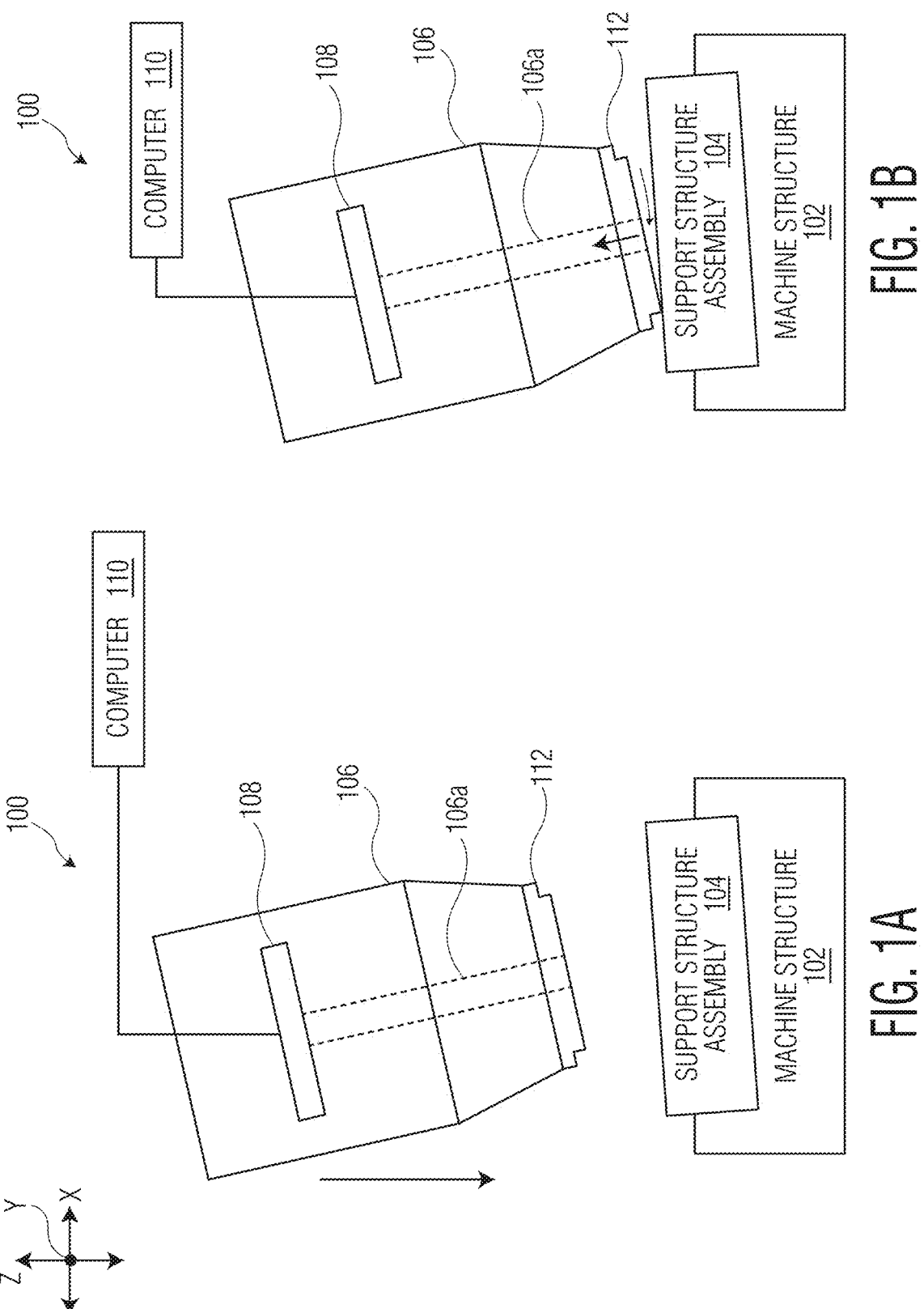
FIGS. 1A-1D are block diagram side views of portions of a bonding system illustrating a method of adjusting a tilt between a bonding tool assembly and a support structure assembly in accordance with an exemplary embodiment of the invention.

Aspects of the invention relate to improvements in the co-planarization of (i) a bonding tool assembly (e.g., a bonding nozzle), and (ii) a support structure assembly (e.g., an adjustable tip-tilt stage) on a bonding system (e.g., a die attach machine, a flip chip bonding machine, a thermocompression bonding machine, etc.).

In accordance with certain exemplary aspects of the invention, a bonding system may be used for performing a local reflow solder die attach process. In such a process, a bonding tool assembly (e.g., a bonding nozzle) places and bonds a semiconductor element (e.g., a die, an interposer, etc.) to a substrate (e.g., a chip, a wafer, etc.) by melting and re-solidifying solder bumps on the semiconductor element being placed. This process requires a high level of parallelism between the bonding tool assembly and the substrate (e.g., controlled to better than 1 μm over the size of the device to the bonded).

According to aspects of the invention, a precise vacuum flow sensor is used in connection with a specialized vacuum nozzle (e.g., with vacuum holes or "inlets" near the perimeter of the die holding area). A support structure assembly (e.g., a pedestal or flat bonding plate on a tilt stage) is also provided. The vacuum flow sensor may be used to sense gaps (e.g., a lack of planarity) between the vacuum nozzle and the support structure assembly. When the vacuum nozzle and support structure assembly are perfectly parallel (or at least substantially parallel), and the vacuum nozzle is pressed against the support structure assembly, the vacuum flow is minimized.

In connection with aspects of the invention, data may be collected and used to find coordinates of improved (and perhaps optimal) parallelism between a bonding tool assembly and a support structure assembly. For example, data points may be collected with coordinates for x-tilt and y-tilt, along with the corresponding vacuum flow (through the vacuum sensor). This data may then be used to determine x-tilt and y-tilt coordinates having improved (and perhaps optimal) parallelism between a bonding tool assembly and a support structure assembly.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

As used herein, the term "bonding system" is intended to refer to any type of system or machine configured for bonding a semiconductor element to a substrate. Exemplary bonding systems include thermocompression bonding systems (TCB), thermosonic bonding systems, flip chip bonding systems, die attach systems, laser assisted bonding systems, pick-and-place systems, etc.

As used herein, the term "bonding tool assembly" is intended to refer to a structure(s) of a bonding system that is configured to be used (i) for bonding a semiconductor element to a substrate, and/or (ii) for contacting a support structure assembly of the bonding system in connection with the inventive systems and methods (including, for example, tilt adjustment methods) described herein. Such bonding tool assemblies may be a single element, or a plurality of elements combined together (e.g., a plurality of elements carried by a bond head). Exemplary bonding tool assemblies include (or may be) one or more of the following: a bonding tool, a placement tool (e.g., for placing a single semiconductor element one at a time, for placing multiple semiconductor elements simultaneously, etc.), a pickup tool, a nozzle, a vacuum workholder, a vacuum calibration tool (e.g., for specific use in connection with tilt adjustment methods recited herein), etc.

As used herein, the term "support structure assembly" is intended to refer to a structure(s) configured to support a substrate or workpiece on a bonding system. Such support structure assemblies may be a single element, or a plurality of elements combined together (e.g., a plurality of elements configured to collectively support a substrate). Exemplary support structure assemblies include (or may be) one or more of the following: a pedestal, a chuck, a tilt stage, a wafer stage, etc.

As used herein, the term "tilt profile" is intended to refer to a plurality of tilt values used in connection with at least one of a bonding tool assembly and a support structure assembly. Such tilt values may include an x-axis tilt value (e.g., a value related to rotation about an x-axis) and a y-axis tilt value (e.g., a value related to rotation about a y-axis). Exemplary tilt profiles include a collection of x-axis tilt values and corresponding y-axis tilt values. Such tilt values may be provided in connection with a time sequence, to provide an efficient tilt adjustment (e.g., see the "spiral" tilt profile shown in FIG. 2). A tilt profile may be a predetermined tilt profile (where the plurality of tilt values are determined prior to a tilting movement).

As used herein, the term "vacuum leakage" is intended to refer to a flow of a gas (typically air) during non-parallel contact at an interface between a bonding tool assembly and support structure assembly. For example, if a vacuum bonding tool is pressed against a surface of a support structure, and there is not a high level of parallelism between the vacuum bonding tool and the surface, vacuum leakage occurs and can be measured using a sensor.

Referring now to the drawings, FIG. 1A illustrates a simplified view of a bonding system 100. Bonding system 100 includes a bonding tool assembly 112 for bonding a semiconductor element to a substrate. Bonding tool assembly 112 is illustrated connected to a bond head 106. Thus, when bond head 106 moves (e.g., along an x-axis, a y-axis, a z-axis, a theta axis, etc., using one or more actuators), bonding tool assembly 112 moves in the same direction. Bonding system 100 also includes a support structure assembly 104 (e.g., for supporting a substrate). Support structure assembly 104 is supported by a machine structure 102 and may tilt with respect to machine structure 102. In FIG. 1A, bonding tool assembly 112 (carried by bond head 106) is positioned above, and moving downward toward, support structure assembly 104. As illustrated in FIG. 1B, bond head 106 has moved down such that bonding tool assembly 112 has made contact with support structure assembly 104. When this contact is made in FIG. 1B, there is a considerable lack of parallelism between bonding tool assembly 112 and support structure assembly 104 (this lack of parallelism is exaggerated for purposes of describing the invention).

Bonding system 100 includes a vacuum sensor 108 (e.g., a flow sensor) for sensing vacuum leakage at an interface (e.g., see FIG. 1C) between bonding tool assembly 112 and support structure assembly 104 (e.g., during contact). In the example shown in FIGS. 1A-1D, vacuum sensor 108 is illustrated as being connected to (or incorporated as part of) bond head 106. Vacuum sensor 108 is used in connection with a tilt adjustment of bonding tool assembly 112 and/or support structure assembly 104. As illustrated in FIG. 1B, while bonding tool assembly 112 is in contact with support structure assembly 104, a vacuum is pulled through an inlet (e.g., vacuum inlet 112*a*2 of bonding tool assembly 112*a* of FIGS. 4A-4C) and through a vacuum path 106*a* defined by bond head 106. Because there is an insufficient seal (e.g., at least partially caused by a lack of parallelism at the interface between bonding tool assembly 112 and support structure assembly 104), some air/gas flows through bonding tool assembly 112, as illustrated by two arrows in FIG. 1B. Vacuum sensor 108 may continuously sense the vacuum leakage/air flow and transmit that information (directly or indirectly) to a computer 110 connected to bond head 106.

Figure 1C:
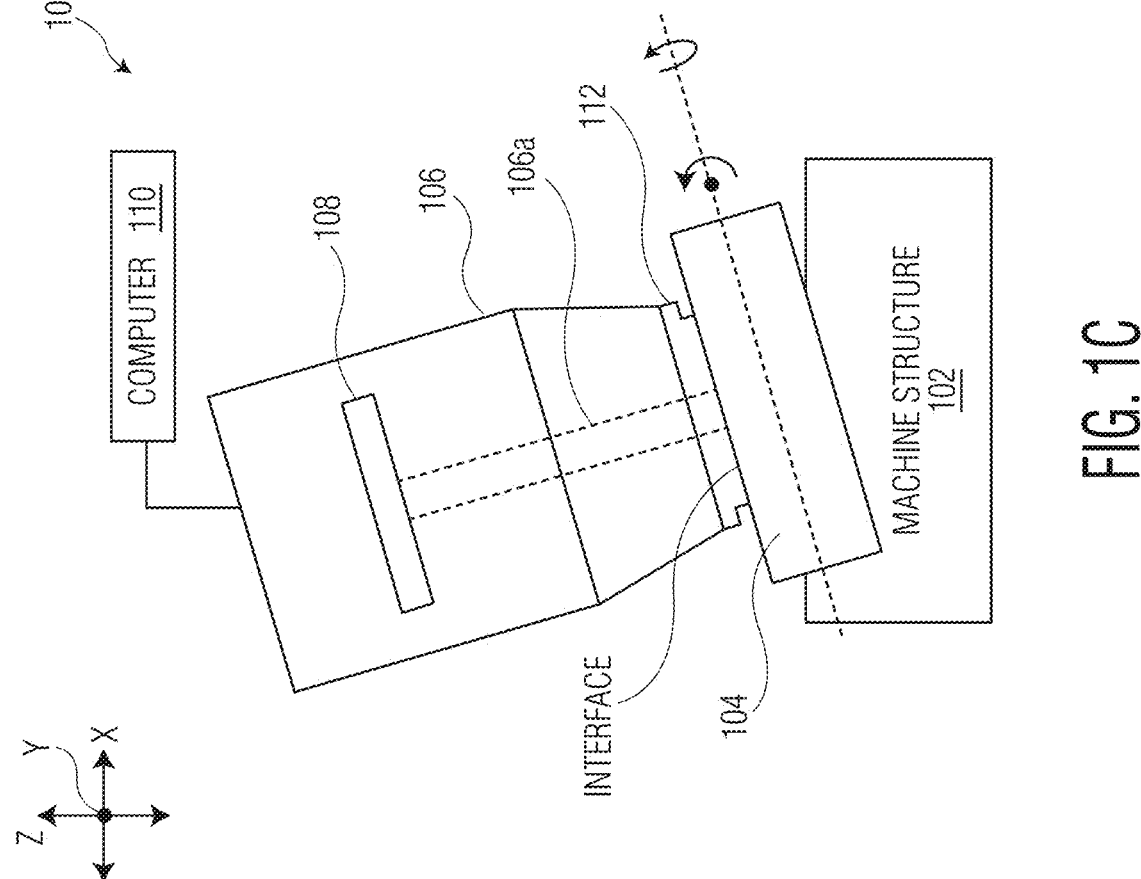

Referring now to FIG. 1C, support structure assembly 104 has been tilted (i.e., about an x-axis and/or y-axis) and positioned such that an improved level of parallelism exists between support structure assembly 104 and bonding tool assembly 112. This improved parallelism results in a better vacuum seal at the interface (e.g., where the improved seal may provide an acceptable level of vacuum leakage, as determined according to predetermined criteria). In the configuration of FIG. 1C, vacuum leakage is sensed at the interface between the bonding tool assembly 112 and the support structure assembly 104; simultaneously, tilt of support structure assembly 104 (and/or bonding tool assembly 112) is adjusted in connection with the vacuum leakage sensed. The operations of sensing vacuum leakage and adjusting tilt may be done repeatedly and/or in accordance with a motion profile (e.g., a tilt profile, a predetermined tilt profile, etc.). As will be understood by those skilled in the art, the tilt adjustment shown in FIG. 1C is intended to represent a variety of exemplary methods of adjusting tilt in accordance with the invention (e.g., see the examples illustrated and described in connection with FIG. 2 and FIGS. 8-11). Although FIG. 1C illustrates the support structure assembly 104 tilting, the invention is not so limited; bonding tool assembly 112 and/or the bond head 106 may also be adjusted in tilt or position.

Figure 1D:
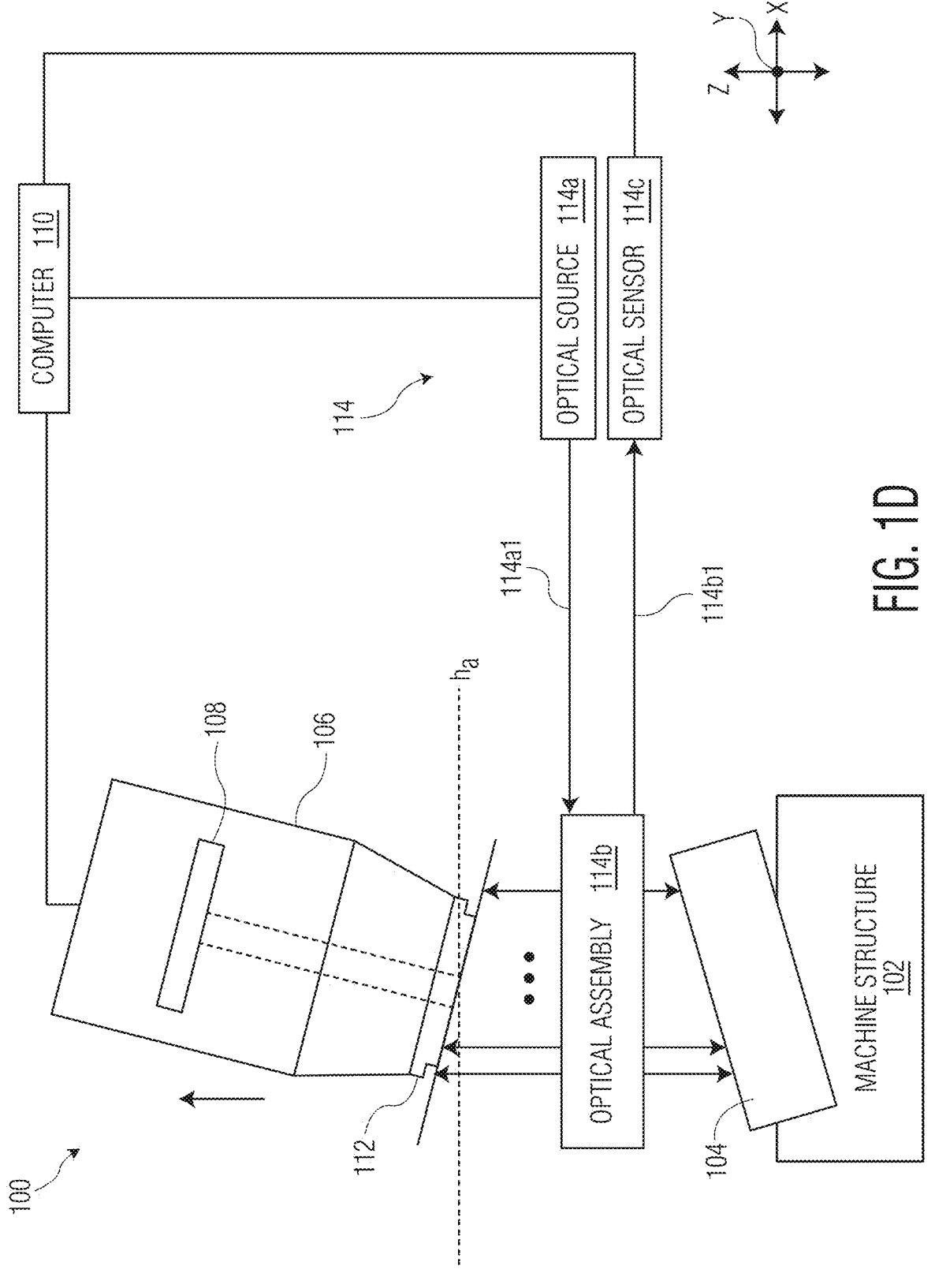

Referring now to FIG. 1D, bond head 106 has been moved vertically (i.e., along the Z-axis) to an alignment height (e.g., a height at which a semiconductor element is held by a bonding tool assembly and is imaged using a camera for alignment purposes), indicated in the illustration as ha. At the alignment height ha, a plurality of distances between portions of support structure assembly 104 and respective portions of the bonding tool assembly 112 are measured using measuring system 114. Measuring system 114 (e.g., a confocal measurement device) includes an optical source 114*a*, an optical assembly 114*b*, and an optical sensor 114*c*. Optical source 114*a* provides an optical signal 114*a*1 to optical assembly 114*b*. This optical signal may be a beam of visible light, a spectrum of light with a variety of characteristics (i.e., wavelengths, frequency, etc.), or a specific optical signal. Optical assembly 114*b* may include a refractive element (e.g., a prism), a reflective element (e.g., a mirror), and/or a lens to provide and/or receive a signal to or from bonding tool assembly 112 and support structure assembly 104. Optical assembly 114*b* provides optical signals directed toward at least one of bonding tool assembly 112 and/or support structure assembly 104 (these signals are shown in FIG. 1D as arrows extending upward and downward from optical assembly 114*b*). These signals reflect off their respective targets, and recombine at optical assembly

114*b*, thereafter providing a single return optical signal 114*b*1. Optical assembly 114*b* may scan a portion of support structure assembly 104 and a respective portion of bonding tool assembly 112; such scanning may be accomplished by physically moving optical assembly 114*b* along a path, moving an optical element (e.g., a lens) of optical assembly 114*b* along a path, or another method. This scanning operation may be along a rectangular path (e.g., see scan path 116 of FIG. 3), a circular path, or any other path sufficient to measure the parallelism between a surface of bonding tool assembly 112 and a respective surface of support structure assembly 104. Optical assembly 114*b* provides return optical signal 114*b*1 to an optical sensor 114*c*. Computer 110 is in communication (directly or indirectly) with optical sensor 114*c* and is configured to determine the plurality of distances using information from optical sensor 114*c* (where such information is determined at least partially based on return optical signal 114*b*1).

In accordance with aspects of the invention, a tilt change caused by moving bonding tool assembly 112 to the alignment height may be determined using the plurality of distance measurements. For example, in FIG. 1C, an acceptable level of parallelism exists at the interface between bonding tool assembly 112 and support structure assembly 104. At FIG. 1D, bond head 106 (including bonding tool assembly 112) has been moved to the alignment height. By determining the plurality of distances as described above, a tilt change from the contact position in FIG. 1C to the alignment height in FIG. 1D may be determined. In the future (e.g., in connection with future bonding operations), this tilt change may be compensated for. That is, in a compensation calculation, one factor may be the tilt change described above. For example, during bonding, a tilt of support structure assembly 104 may be changed to compensate for multiple factors including the tilt change described above.

Figure 2:
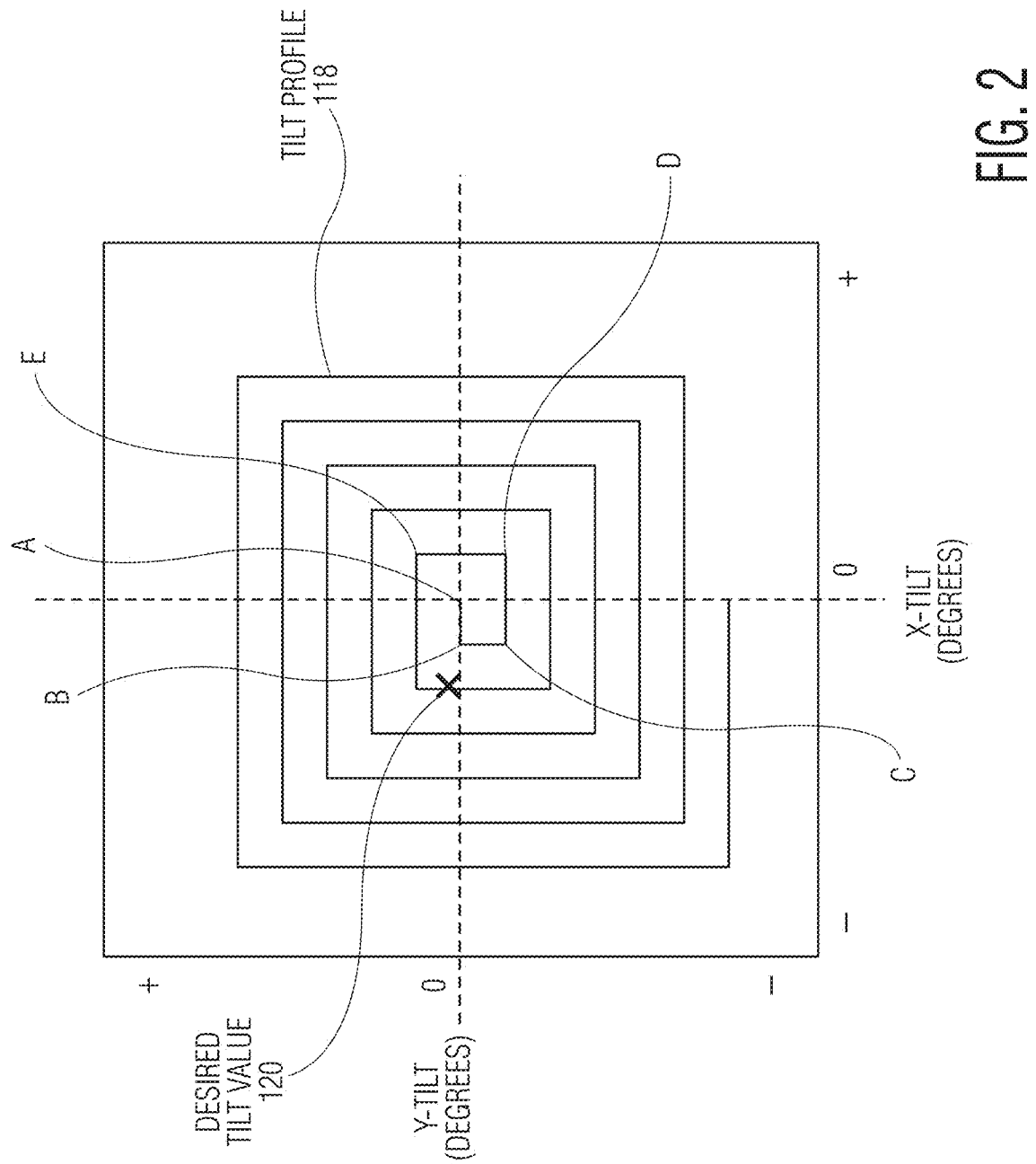
FIG. 2 is a graphical illustration of a tilt profile for at least one of (i) the bonding tool assembly and (ii) the support structure assembly, in accordance with an exemplary embodiment of the invention.

Referring now to FIG. 2, an example tilt profile 118 is illustrated. The tilt (e.g., about an x-axis and/or a y-axis) of support structure assembly 104 may be adjusted to a desired tilt value 120 such that an acceptable level of vacuum leakage is determined (e.g., see FIG. 1B). In determining such a desired tilt value, support structure assembly 104 may be tilted by following a tilt profile 118 (e.g., a predetermined tilt profile). In the illustrated tilt profile 118, a support structure assembly 104 (or bonding tool assembly) starts out at position "A" with a 0 degree tilt about the x-axis and the y-axis. Support structure assembly then tilts only about the x-axis (in a negative direction) to position "B"; support structure assembly then stops tilting about the x-axis and starts tilting only about the y axis (in a negative direction) to position "C"; support structure assembly then stops tilting about the y-axis and starts tilting only about the x-axis (in a positive direction) to position "D"; support structure assembly then stops tilting about the x-axis and starts tilting only about the y-axis (in a positive direction) to position "E". The support structure assembly continues in a similar fashion until tilt profile 118 is completed. This tilt profile 118 is followed while continuously sensing vacuum leakage (i.e., at an interface between a bonding tool assembly and a support structure assembly). The degree to which vacuum leakage is sensed (e.g., the signal to noise ratio) may depend on a variety of factors, such as where vacuum inlets are located (e.g., the distance between a plurality of vacuum inlets, the size of a vacuum inlet, etc.), the size of the bonding tool assembly, the flatness of the bonding tool assembly or support structure assembly, the strength of the vacuum pulled, the sensitivity of the vacuum sensor, and other factors. Using tilt profile 118 and the data collected in connection with the vacuum leakage sensed (and other information such as the geometry of the bonding tool assembly and/or the support structure assembly), a desired tilt value 120 (e.g., a tilt value resulting in minimal vacuum leakage, an acceptable level of vacuum leakage, etc.) may be determined. A computer in communication with the vacuum sensor determines the tilt value of at least one of the bonding tool assemblies and the support structure assembly (e.g., where the desired tilt value may correspond to the tilt resulting in a minimal level of vacuum leakage at the interface). In one or more future operations, a desired tilt value may be used to adjust a tilt of at least one of the bonding tool assemblies and the support structure assembly.

Figure 3:
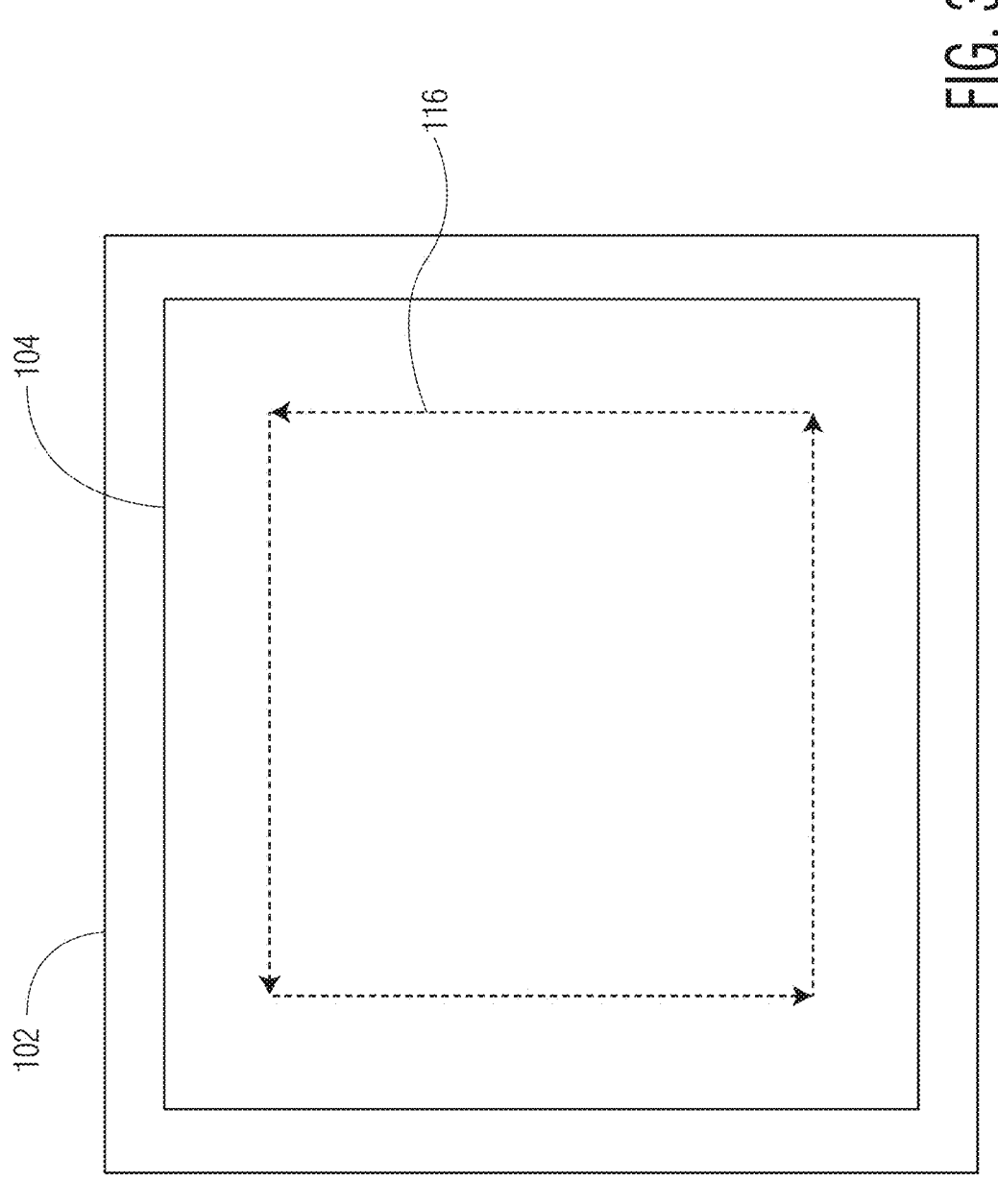
FIG. 3 is a block diagram plan view illustrating a scan path used in connection with measuring a plurality of distances between portions of a support structure assembly and respective portions of a bonding tool assembly in accordance with an exemplary embodiment of the invention.

Referring now to FIG. 3, scan path 116 is illustrated in connection with a plan view of support structure assembly 104. As described above in connection with FIG. 1D, measuring system 114 collects a plurality of measurements along scan path 116 between bonding tool assembly 112 and support structure assembly 104. These measurements may be used to determine a tilt change caused by the movement of bonding tool assembly 112 to an alignment height.

Figure 4A:
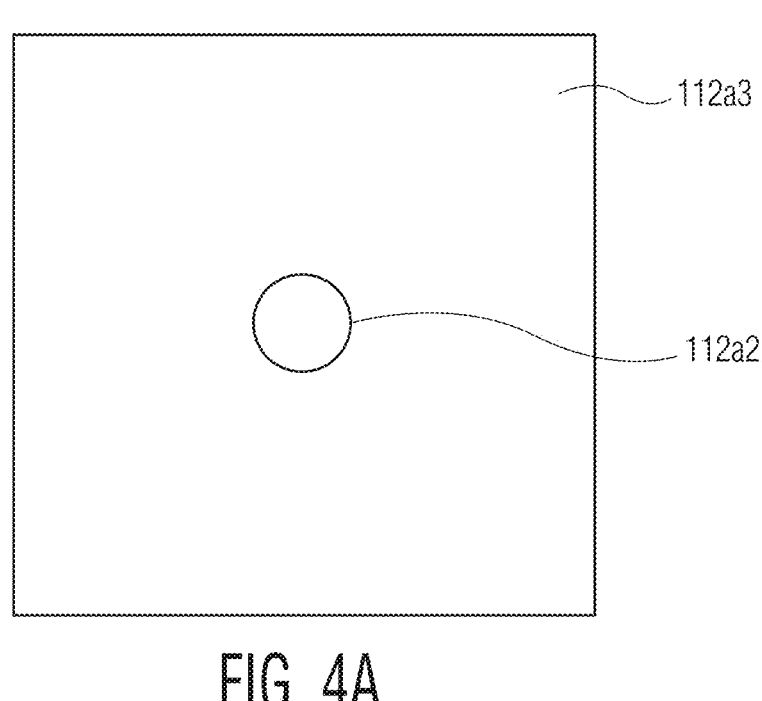
FIGS. 4A-4C are various views of a bonding tool assembly with a single vacuum inlet in accordance with an exemplary embodiment of the invention.
Figure 4B:
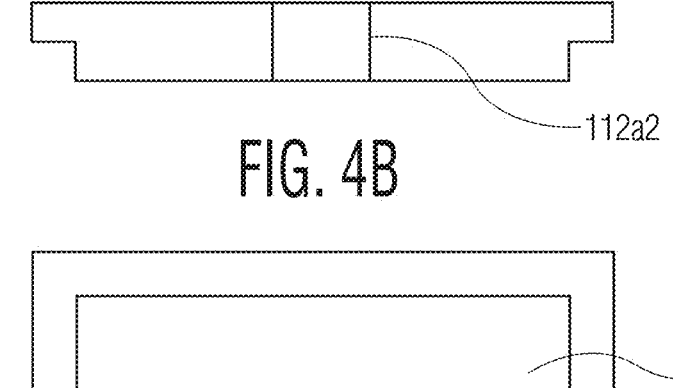
Figure 4C:
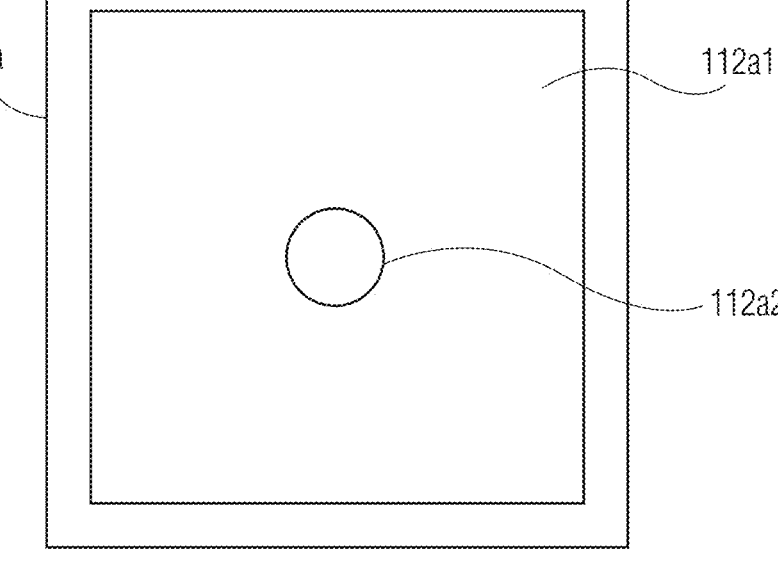

FIGS. 4A-4C, 5A-5C, 6A-6C, and 7A-7C illustrate various embodiments of bonding tool assembly 112 of FIG. 1A-1C. Referring specifically to FIGS. 4A-4C, bonding tool assembly 112a is illustrated. Bonding tool assembly 112a defines a vacuum inlet 112a2 between a contact surface 112a1 (i.e., the surface intended to make contact with support structure assembly 104 such as shown in FIGS. 1B-1C) and an opposite surface 112a3 (i.e., the surface proximate to bond head 106). Vacuum inlet 112a2 is intended to communicate and interact with vacuum sensor 108 via vacuum path 106a of bond head 106. As described in connection with certain embodiments of FIGS. 1A-1C, FIG. 2, and FIGS. 8-11, a contact surface of support structure assembly 104 is tilted with respect to contact surface 112a1 of bonding tool assembly 112a (or vice versa) about an x-axis (and/or a y-axis) and a vacuum leakage is sensed (i.e., detected or measured continuously or intermittently).

Figure 5A:
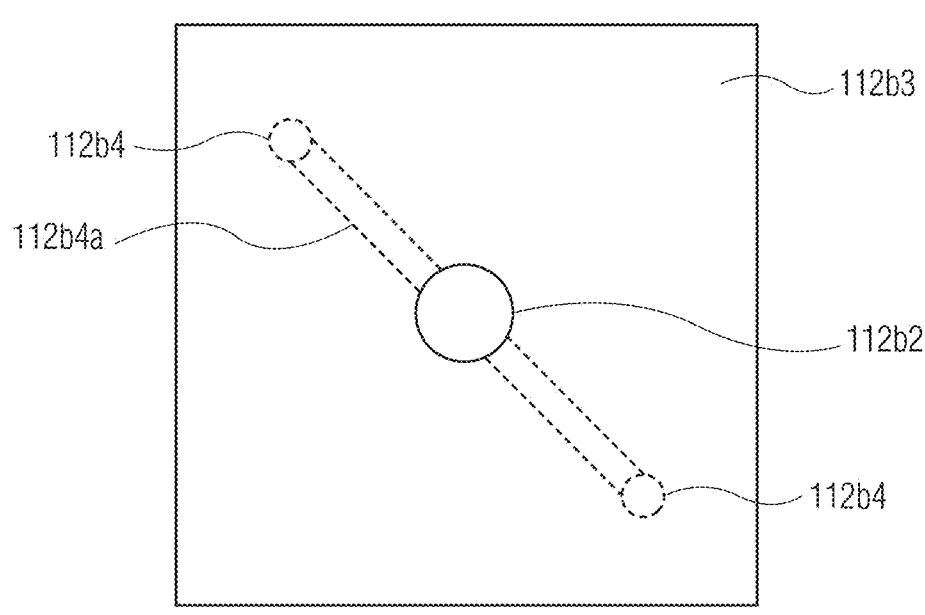
FIGS. 5A-5C are various views of another bonding tool assembly with two vacuum inlets in accordance with an exemplary embodiment of the invention.
Figure 5B:
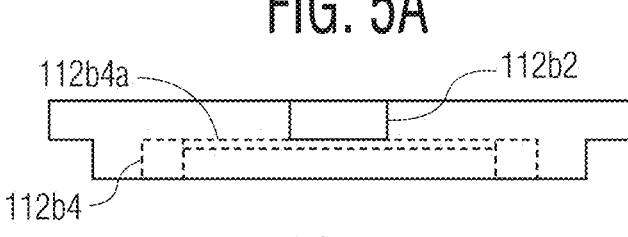
Figure 5C:
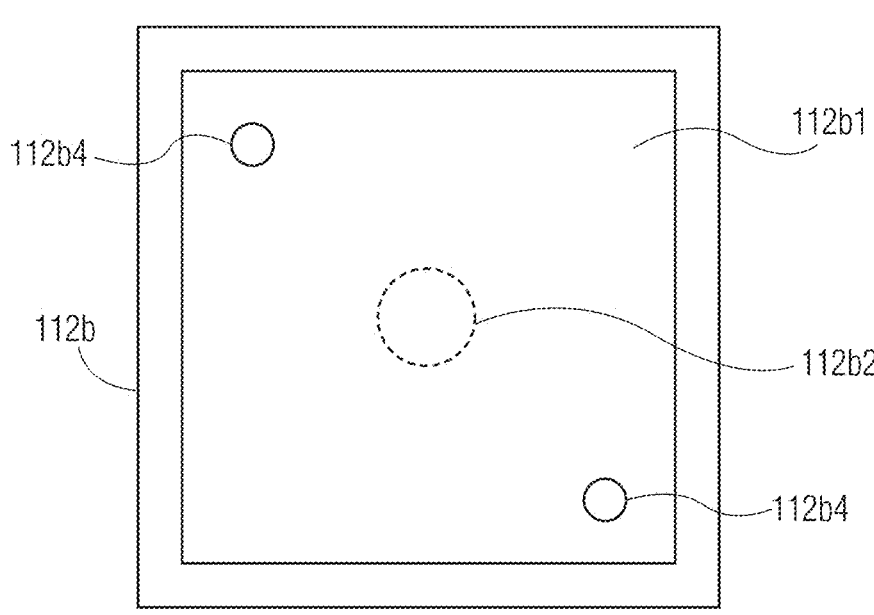

Referring now to FIGS. 5A-5C, bonding tool assembly 112b is illustrated. Bonding tool assembly 112b defines a contact surface 112b1 (i.e., the surface intended to make contact with support structure assembly 104 such as shown in FIGS. 1B-1C) and an opposite surface 112b3 (i.e., the surface proximate to bond head 106). Bonding tool assembly 112b defines two vacuum inlets 112b4 at contact surface 112b1. Bonding tool assembly 112b also defines a vacuum inlet 112b2 (e.g., a main vacuum inlet, a central vacuum inlet, etc.) to communicate/interact with the two vacuum inlets 112b4 via vacuum inlet paths 112b4a. Thus, a vacuum pathway is formed from the combination of vacuum inlets 112b4, vacuum inlet paths 112b4a, and vacuum inlet 112b2 such that a vacuum through this pathway may communicate and interact with vacuum sensor 108 via vacuum path 106a of bond head 106. As described in connection with certain embodiments of FIGS. 1A-1C, FIG. 2, and FIGS. 8-11, a contact surface of support structure assembly 104 is tilted with respect to contact surface 112b1 (or vice versa) about an x-axis (and/or a y-axis) and a vacuum leakage is sensed (i.e., detected or measured continuously or intermittently).

Figures 6A, 6B, 6C:
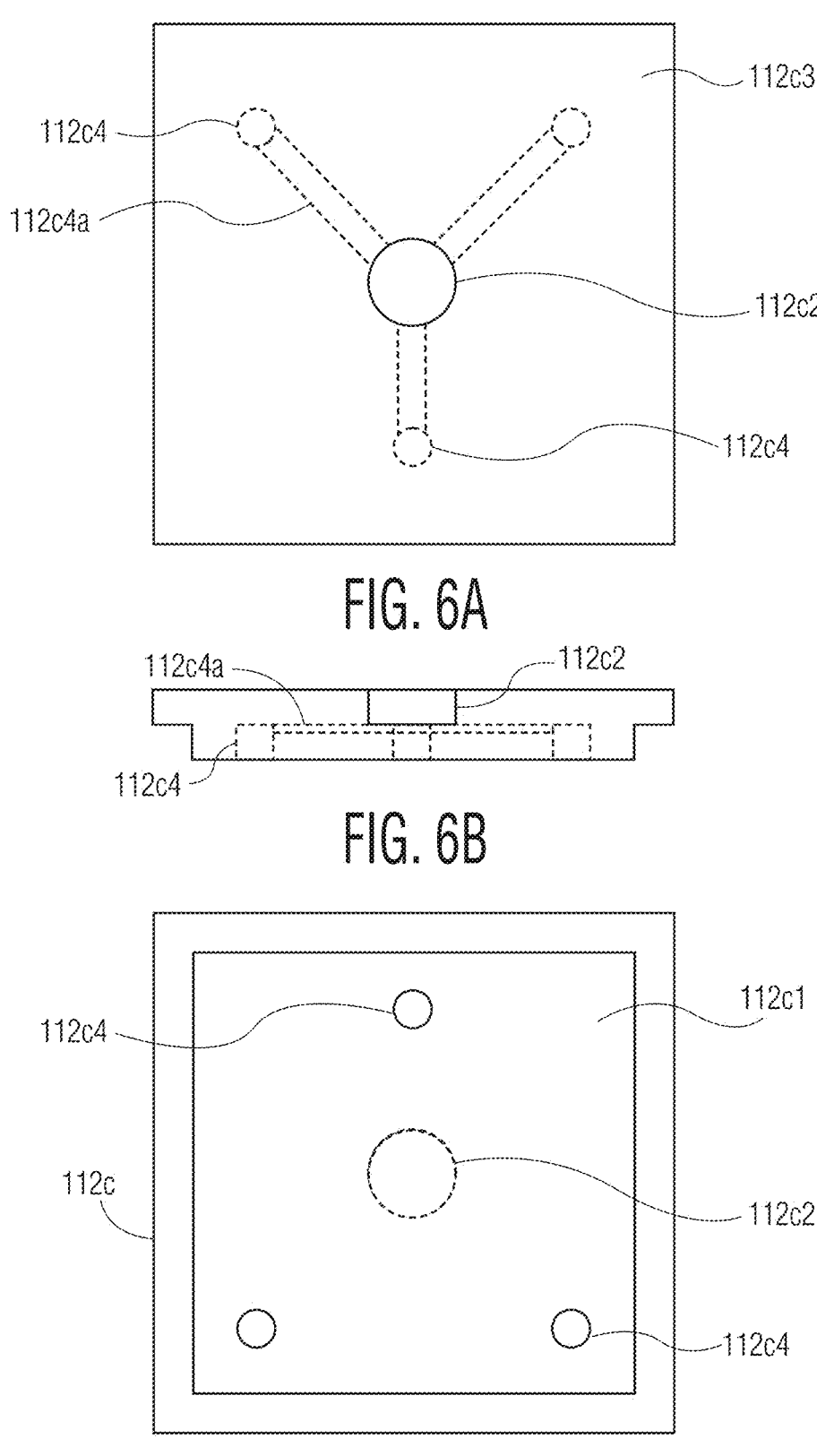
FIGS. 6A-6C are various views of yet another bonding tool assembly with three vacuum inlets in accordance with an exemplary embodiment of the invention.

Referring now to FIGS. 6A-6C, bonding tool assembly 112c is illustrated. Bonding tool assembly 112c defines a contact surface 112c1 (i.e., the surface intended to make contact with support structure assembly 104 such as shown in FIGS. 1B-1C) and an opposite surface 112c3 (i.e., the surface proximate to bond head 106). Bonding tool assembly 112c defines three vacuum inlets 112c4 at contact surface 112c1. Bonding tool assembly 112c also defines a vacuum inlet 112c2 (e.g., a main vacuum inlet, a central vacuum inlet, etc.) to communicate/interact with the three vacuum inlets 112c4 via vacuum inlet paths 112c4a. Thus, a vacuum pathway is formed from the combination of vacuum inlets 112c4, vacuum inlet paths 112c4a, and vacuum inlet 112c2 such that a vacuum through this pathway may communicate and interact with vacuum sensor 108 via vacuum path 106a of bond head 106. As described in connection with certain embodiments of FIGS. 1A-1C, FIG. 2, and FIGS. 8-11, a contact surface of support structure assembly 104 is tilted with respect to contact surface 112c1 (or vice versa) about an X-axis (and/or a Y-axis) and a vacuum leakage is sensed (i.e., detected or measured continuously or intermittently).

Figures 7A, 7B, 7C:
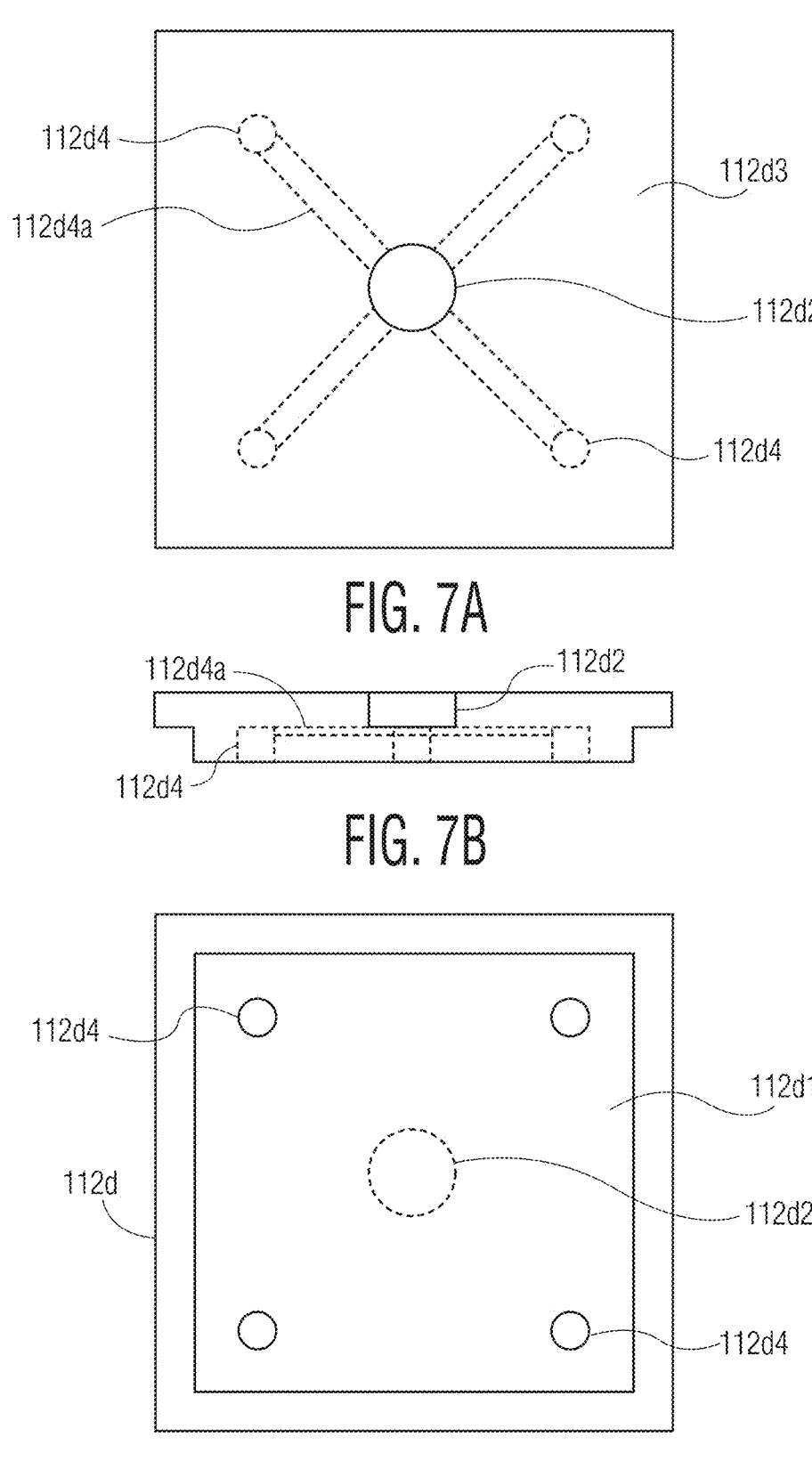
FIGS. 7A-7C are various views of yet another bonding tool assembly with four vacuum inlets in accordance with an exemplary embodiment of the invention.

Referring now to FIGS. 7A-7C, bonding tool assembly 112d is illustrated. Bonding tool assembly 112d defines a contact surface 112d1 (i.e., the surface intended to make contact with support structure assembly 104 such as shown in FIGS. 1B-1C) and an opposite surface 112d3 (i.e., the surface proximate to bond head 106). Bonding tool assembly 112d defines four vacuum inlets 112d4 at contact surface 112d1. Bonding tool assembly 112d also defines a vacuum inlet 112d2 (e.g., a main vacuum inlet, a central vacuum inlet, etc.) to communicate/interact with the four vacuum inlets 112d4 via vacuum inlet paths 112d4a. Thus, a vacuum pathway is formed from the combination of vacuum inlets 112d4, vacuum inlet paths 112d4a, and vacuum inlet 112d2 such that a vacuum through this pathway may communicate and interact with vacuum sensor 108 via vacuum path 106a of bond head 106. As described in connection with certain embodiments of FIGS. 1A-1C, FIG. 2, and FIGS. 8-11, a contact surface of support structure assembly 104 is tilted with respect to contact surface 112d1 (or vice versa) about an x-axis (and/or a y-axis) and a vacuum leakage is sensed (i.e., detected or measured continuously or intermittently).

In contrast to bonding tool assembly 112a, the location of vacuum inlets 112b4, 112c4, and 112d4 near the respective outer portions of contact surfaces 112b1, 112c1, and 112d1 may provide a greater degree to which vacuum leakage is able to be sensed (e.g., the signal to noise ratio may be improved in some applications).

Although FIGS. 4A-4C, 5A-5C, 6A-6C, and 7A-7C illustrate various embodiments of bonding tool assembly 112 with a centrally located vacuum inlet on an opposite surface, the invention is not so limited (e.g., a plurality of inlets may be utilized, a single non-centrally located vacuum inlet may be utilized, etc.). Similarly, although the drawings illustrate up to 4 total vacuum inlets on a contact surface, more than four inlets may be used in a variety of configurations (e.g., a circular configuration, a diamond configuration, a hexagonal configuration, or any other configuration).

FIGS. 8-11 are a flow diagrams illustrating various methods of adjusting a tilt between a bonding tool assembly and a support structure assembly of a bonding system. As is understood by those skilled in the art, certain steps included in the flow diagram may be omitted; certain additional steps may be added; and the order of the steps may be altered from the order illustrated—all within the scope of the invention.

Referring now specifically to FIG. 8, at Step 802, a bonding tool assembly of a bonding system is brought into contact with a support structure assembly of the bonding system (e.g., see bonding tool assembly 112, support structure assembly 104, and bonding system 100 of FIG. 1B). At Step 804, a vacuum leakage is sensed at an interface between the bonding tool assembly and the support structure assembly (e.g., see vacuum sensor in FIGS. 1A-1D, and interface at FIG. 1C). At Step 806, a tilt of at least one of (i) the bonding tool assembly and (ii) the support structure assembly is adjusted in response to the vacuum leakage sensed in Step 804 (e.g., see adjusted tilt shown in FIG. 1C). At optional Step 808, a determination is made as to whether the level of vacuum leakage is acceptable. If the level of vacuum leakage is not acceptable, Step 806 (and/or Step 804) is repeated. If the level of vacuum leakage is acceptable, optional Step 810 is conducted. At optional Step 810, a tilt value of at least one of the bonding tool assembly and the support structure assembly is determined using information from Steps 804 and 806 (e.g., the tilt value may be for use in a future bonding operation).

Referring now to FIG. 9, at Step 902, a bonding tool assembly of a bonding system is brought into contact with a support structure assembly of the bonding system (e.g., see bonding tool assembly 112, support structure assembly 104, and bonding system 100 of FIG. 1B). At Step 904, a vacuum leakage is sensed at an interface between the bonding tool assembly and the support structure assembly (e.g., see vacuum sensor in FIGS. 1A-1D, and interface at FIG. 1C). At Step 906, a tilt of at least one of (i) the bonding tool assembly and (ii) the support structure assembly is adjusted in response to the vacuum leakage sensed in Step 904 (e.g., see adjusted tilt shown in FIG. 1C). At optional Step 908, a determination is made as to whether the level of vacuum leakage is acceptable. If the level of vacuum leakage is not acceptable, Step 906 (and/or Step 904) is repeated. If the level of vacuum leakage is acceptable, optional Step 910 is conducted. At optional Step 910, a tilt value of at least one of the bonding tool assembly and the support structure assembly is determined using information from Steps 904 and 906 (e.g., the tilt value may be for use in a future bonding operation). At optional Step 912, at least one of the bonding tool assembly and the support structure assembly is moved to the tilt value (e.g., see adjusted tilt shown in FIG. 1C, which may be this new tilt value). At optional Step 914, the bonding tool assembly is moved to an alignment height (e.g., see FIG. 1D). At optional Step 916, a plurality of distances are measured between portions of the support structure assembly and respective portions of the bonding tool assembly with the bonding tool assembly at the alignment height (e.g., see FIG. 1D). At optional Step 918, a tilt change caused by moving the bonding tool assembly to the alignment height is determined using the plurality of distance measurements. At optional Step 920, the tilt value is compensated for the tilt change determined in Step 918 in connection with a future bonding operation.

Referring now to FIG. 10, at Step 1002, a bonding tool assembly of a bonding system is brought into contact with a support structure assembly of the bonding system (e.g., see bonding tool assembly 112, support structure assembly 104, and bonding system 100 of FIG. 1B). At Step 1004, a tilt of at least one of (i) the bonding tool assembly and (ii) the support structure assembly is adjusted according to a tilt profile (e.g., a predetermined tilt profile) (e.g., see FIG. 1C and FIG. 2). At Step 1006, a vacuum leakage is sensed at an interface between the bonding tool assembly and the support structure assembly during Step 1004 (e.g., see vacuum sensor in FIGS. 1A-1D, and interface at FIG. 1C). At optional Step 1008, the tilt of at least one of (i) the bonding tool assembly and (ii) the support structure assembly is further adjusted in response to the vacuum leakage sensed in Step 1006. At optional Step 1010, a tilt value of at least one of the bonding tool assembly and the support structure assembly is determined using information from Steps 1004 and 1006 (and/or Step 1008) (e.g., the tilt value may be for use in a future bonding operation).

Referring now to FIG. 11, at Step 1102, a bonding tool assembly of a bonding system is brought into contact with a support structure assembly of the bonding system (e.g., see bonding tool assembly 112, support structure assembly 104, and bonding system 100 of FIG. 1B). At Step 1104, a tilt of at least one of (i) the bonding tool assembly and (ii) the support structure assembly is adjusted according to a tilt profile (e.g., a predetermined tilt profile) (e.g., see FIG. 1C and FIG. 2). At Step 1106, a vacuum leakage is sensed at an interface between the bonding tool assembly and the support structure assembly during Step 1104 (see vacuum sensor in FIGS. 1A-1D, and interface at FIG. 1C). At optional Step 1108, the tilt of at least one of (i) the bonding tool assembly and (ii) the support structure assembly is further adjusted in response to the vacuum leakage sensed in Step 1106. At optional Step 1110, a tilt value is determined of at least one of the bonding tool assembly and the support structure assembly using information from Steps 1104 and 1106 (and/or 1108) (e.g., the tilt value may be for use in a future bonding operation). At optional Step 1112, at least one of the bonding tool assembly and the support structure assembly is moved to the tilt value (e.g., see adjusted tilt shown in FIG. 1C, which may be this new tilt value). At optional Step 1114, the bonding tool assembly is moved to an alignment height (e.g., see FIG. 1D). At optional Step 1116, a plurality of distances between portions of the support structure assembly and respective portions of the bonding tool assembly are measured with the bonding tool assembly at the alignment height (e.g., see FIG. 1D). At optional Step 1118, a tilt change caused by moving the bonding tool assembly to the alignment height is determined using the plurality of distance measurements. At optional Step 1120, the tilt value is compensated for the tilt change determined in step 1118 in connection with a future bonding operation.

Although the invention has been described primarily in connection with bonding of a single semiconductor element to a substrate, it is not limited thereto. The various exemplary aspects of the invention are intended to cover bonding systems and methods simultaneously carrying and/or bonding multiple semiconductor elements. Further, the invention is not limited to "bonding", as the invention may relate to systems and methods temporarily carrying and/or placing semiconductor elements (without a permanent "bonding" action like a thermocompression bonding action).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding system for bonding a semiconductor element to a substrate, the bonding system comprising:
    (a) a bonding tool assembly for bonding a semiconductor element to a substrate;
    (b) a support structure assembly for supporting the substrate;
    (c) a vacuum sensor for sensing a vacuum leakage at an interface between the bonding tool assembly and the support structure assembly during contact therebetween in connection with a tilt adjustment between the bonding tool assembly and the support structure assembly,
    wherein the tilt adjustment between the bonding tool assembly and the support structure assembly follows a predetermined tilt profile, the predetermined tilt profile including a plurality of tilt values determined prior to the tilt adjustment, and wherein the vacuum sensor senses the vacuum leakage at the interface during the tilt adjustment according to the predetermined tilt profile; and (d) a computer in communication with the vacuum sensor, the computer configured to determine a desired tilt value of at least one of the bonding tool assembly and the support structure assembly using the vacuum leakage sensed by the vacuum sensor.

2. The bonding system of claim 1 wherein a tilt of at least one of the bonding tool assembly and the support structure assembly is adjusted until an acceptable level of vacuum leakage is sensed by the vacuum sensor.

3. The bonding system of claim 1 wherein the bonding tool assembly includes a vacuum calibration tool, and wherein the vacuum calibration tool is brought into contact with the support structure assembly in connection with sensing the vacuum leakage between the bonding tool assembly and the support structure assembly.

4. The bonding system of claim 1 wherein the bonding tool assembly includes a nozzle, and wherein the nozzle is brought into contact with the support structure assembly in connection with sensing the vacuum leakage between the bonding tool assembly and the support structure assembly.

5. The bonding system of claim 1 wherein the support structure assembly includes at least one of a pedestal, a chuck, a tilt stage, and a wafer stage.

6. The bonding system of claim 1 wherein the desired tilt value corresponds to a tilt resulting in a minimal level of vacuum leakage at the interface.

7. The bonding system of claim 1 wherein at least one of the bonding tool assembly and the support structure assembly is configured to move to the desired tilt value, and the bonding tool assembly is configured to move to an alignment height, and wherein a plurality of distances are measured between portions of the support structure assembly and respective portions of the bonding tool assembly with the bonding tool assembly at the alignment height, and wherein a tilt change caused by moving the bonding tool assembly to the alignment height is determined using the plurality of distance measurements.

8. The bonding system of claim 7 further comprising a measuring system for measuring the plurality of distances, the measuring system including an optical source for providing an optical signal directed toward at least one of the bonding tool assembly and the support structure assembly, and an optical sensor for receiving a reflected optical signal from at least one of the bonding tool assembly and the support structure assembly, wherein the computer is in communication with the optical sensor and is configured to determine the plurality of distances using information from the optical sensor.

9. The bonding system of claim 7 wherein the bonding system is configured to compensate for the tilt change caused by moving the bonding tool assembly to the alignment height in connection with a future bonding operation.

10. The bonding system of claim 1 wherein the bonding tool assembly includes a plurality of vacuum inlets at the interface.

11. The bonding system of claim 1 wherein the bonding tool assembly is configured to carry a plurality of semiconductor elements simultaneously.

12. The bonding system of claim 1 wherein the vacuum sensor is used to determine the desired tilt value between the bonding tool assembly and the support structure assembly that corresponds to a tilt resulting in a minimal level of vacuum leakage at the interface.

* * * * *